United States Patent [19]
Smith et al.

[11] Patent Number: 5,639,300
[45] Date of Patent: Jun. 17, 1997

[54] EPITAXY WITH REUSABLE TEMPLATE

[75] Inventors: Henry I. Smith, Sudbury; Carl V. Thompson, Burlington, both of Mass.

[73] Assignee: Massachusetts Institute of Technology, Cambridge, Mass.

[21] Appl. No.: 814,327

[22] Filed: Dec. 23, 1991

Related U.S. Application Data

[63] Continuation of Ser. No. 680,629, Apr. 1, 1991, abandoned, which is a continuation of Ser. No. 129,716, Dec. 7, 1987, abandoned.

[51] Int. Cl.$^6$ .................................................. C30B 25/04
[52] U.S. Cl. .................................... 117/37; 117/922
[58] Field of Search .............. 156/DIG. 80, DIG. 88, 156/603, 616.1–616.4, 620.7, 620.71, 620.73; 437/84, 93, 174, 247; 148/DIG. 152

[56] References Cited

U.S. PATENT DOCUMENTS

| | | | |
|---|---|---|---|
| 4,333,792 | 6/1982 | Smith | 156/612 |
| 4,475,980 | 10/1984 | Rhemer et al. | 156/603 |
| 4,479,846 | 10/1984 | Smith et al. | 156/603 |
| 4,534,820 | 8/1985 | Mori et al. | 156/603 |
| 4,565,599 | 1/1986 | Geis et al. | 156/603 |

OTHER PUBLICATIONS

Fan et al., "Graphite–Strip–Heater Zone–Melting Recrystallization of Si Films", J. Crys. Growth 63(1983) 453–483.

*Primary Examiner*—R. Bruce Breneman
*Assistant Examiner*—Felisa Garrett
*Attorney, Agent, or Firm*—Fish & Richardson P.C.

[57] ABSTRACT

A template having a surface relief structure contacts a thin crystalline film on a substrate to align the film in accordance with the surface relief structure.

13 Claims, 4 Drawing Sheets

EPITAXY WITH REUSABLE TEMPLATE

This application is a continuing application of application Ser. No. 07/680,629 filed Apr. 1, 1991, now abandoned, which was a continuing application of application Ser. No. 07/129,716 filed Dec. 7, 1987, now abandoned.

The Government has rights in this invention pursuant to Grant Number ECS-8506565 and Contract Number AFOSR-85-0154D awarded by the National Science Foundation and Department of the Air Force.

The present invention relates to thin films of oriented crystalline material. Thin films of oriented crystalline material are important in many fields of science and technology, most notably in electronics and electro-optics. One of the more difficult yet important challenges in this area is to develop methods for obtaining high-quality single-crystal and quasi-single-crystal films on substrates that differ radically in chemical composition and crystalline structure from the film. For example, scientists have for many years been developing means of producing highly oriented crystalline films on amorphous substrates, as described in the following U.S. patents:

(1) U.S. Pat. No. 4,479,846 granted Oct. 30, 1984 entitled METHOD OF ENTRAINING DISLOCATIONS AND OTHER CRYSTALLINE DEFECTS IN HEATED FILM CONTACTING PATTERNED REGION, H. I. Smith and M. W. Geis.

(2) U.S. Pat. No. 4,632,723 granted Dec. 30, 1986 entitled ORIENTATION FILTERING FOR CRYSTALLINE FILMS, H. I. Smith, H. A. Atwater, C. V. Thompson and M. W. Geis.

(3) U.S. Pat. No. 4,576,676 granted Mar. 18, 1986 entitled THICK CRYSTALLINE FILMS ON FOREIGN SUBSTRATES, H. I. Smith, H. A. Atwater and M. W. Geis.

(4) U.S. Pat. No. 4,333,793 granted Jun. 8, 1982 entitled ENHANCING EPITAXY AND PREFERRED ORIENTATION, H. I. Smith.

(5) U.S. Pat. No. 4,565,599 granted Jan. 21, 1986 entitled GRAPHOEPITAXY BY ENCAPSULATION, M. W. Geis, H. I. Smith, D. A. Antoniadis and D. C. Flanders.

Patents (1) to (3) describe methods that involve melting and resolidification of the material that forms the film, and patents (4) and (5) are not limited to situations in which melting occurs. Patent (4) involves producing artificial patterns in the surface of a substrate and thereafter depositing a film to be oriented on said surface. Patent (5) extends the concept of patterning to include putting a relief structure in the film after deposition, and following that with the deposition of a fixed cap.

The present invention results from the discovery that relief structure can be fabricated in a second element or piece, a so-called template, which is pressed onto the film to be oriented. Furthermore, this invention offers many advantages over previous methods.

It is an important object of this invention to provide improved apparatus and techniques for enhancing epitaxy.

SUMMARY OF THE INVENTION

According to the invention, one intentionally creates at predetermined locations in a solid piece artificial surface-relief structure; said piece to be known hereafter as the template.

Independent of the template, one deposits a film to be oriented on a solid substrate. Said film may be amorphous, polycrystalline or single crystalline with a number of defects that need to be removed. Said solid substrate may be amorphous, polycrystalline or single crystalline. Thereafter, the template is pressed onto the top surface of said film. It may either be held stationary or moved. Generally, one then raises the temperature of the film or applies some other means to cause atoms to move about, so as to cause a reorientation of the film in accordance with the template geometry. That is, the template provides a geometry which is impressed on or in the film such that the crystallographic orientation of the film is changed to be in accord with the impressed geometry. Other features, objects and advantages of the invention will become apparent from the following specification when read in connection with the accompanying drawing in which:

DETAILED DESCRIPTION OF PREFERRED EMBODIMENTS

Figure 1A:
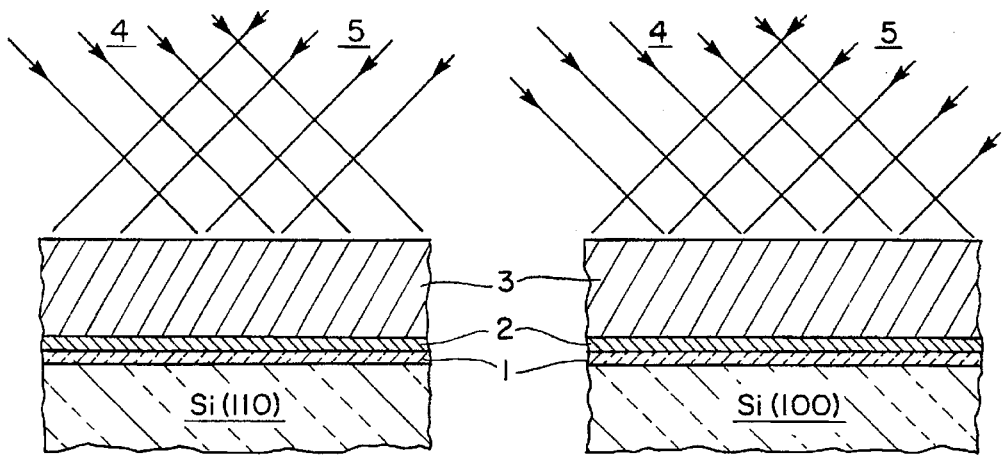
FIGS. 1a–1h illustrate techniques for fabricating surface relief structures in a Silicon single-crystal substrate.
Figure 1B:
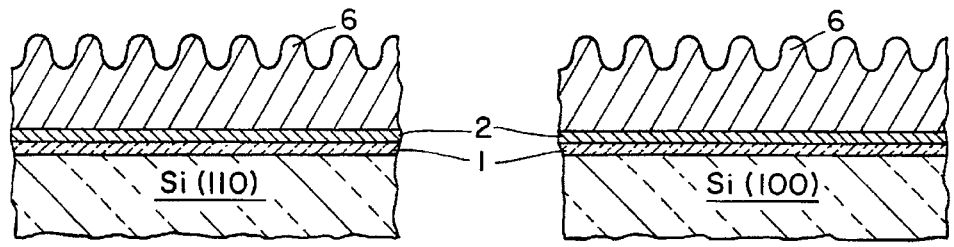
Figure 1C:
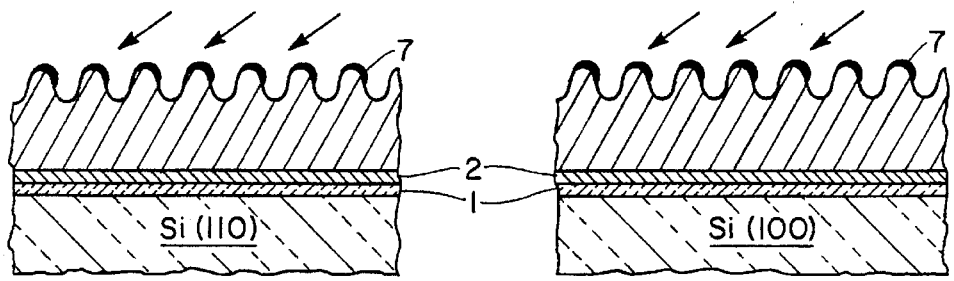

With reference now to the drawing, there is shown in FIGS. 1a–1h a method for fabricating two types of surface relief structure in a Silicon (Si) single-crystal substrate. In the left half of FIGS. 1a–1h a single crystal Si substrate with an orientation designated as (110) is shown, and, in the right half, one with an orientation designated as (100) is shown. Both types of Si substrates are coated with identical layers of films. The Si substrates can be obtained commercially in the specified orientations, as is well known in modern industrial practice. Said commercially available Si substrates are low cost yet they are of extremely high purity, and the crystallographic defects known as dislocations are substantially absent. Thus, as a practical matter, the Si substrates can be considered perfect, defect-free single crystals.

Both (110) and (100) Si substrates are coated with a film of $Si_3N_4$, 1, about 30 nm (300 Å) thick. Methods of depositing such films are well known to anyone skilled in modern Si processing technology.

Thereafter a film of Titanium (Ti), 2, about 30 nm thick is deposited on top of the $Si_3N_4$, preferably by the process known as electron beam evaporation. Following this the Ti is coated with a film of photoresist, 3, about 400 nm thick. The preferred photoresist is one of the types that combine a novolak resin and a diazoquinone photosensitive component. Such photoresists are widely used in the Si processing industry and are commercially available.

Figure 1D:
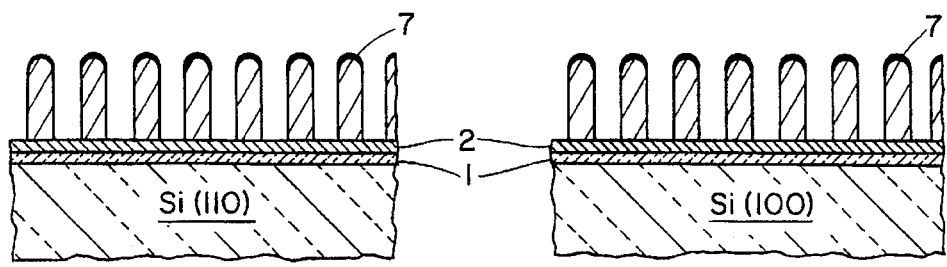

The photoresist is exposed to a light pattern produced by the overlap and interference of two laser beams, 4 and 5, as described in the literature [E. H. Anderson, C. M. Horwitz and H. I. Smith, "Holographic Lithography with Thick Photoresist", Appl. Phys. Lett., 49, 874 (1983)]. Said article by Anderson et al, also describes the sequence of steps depicted in FIGS. 1b, 1c and 1d. These are, respectively, development of a grating relief structure, 6, in the top surface of the photoresist; evaporation at an oblique angle of a metal, 7, such as Ti, Cr or Nichrome alloy, onto the surface relief grating; reactive-ion etching in an oxygen plasma down through the photoresist, using the metal, 7, as a mask. This defines a relief grating of relatively thick photoresist lines standing on a substrate, as shown in FIG. 1d.

Figure 1E:
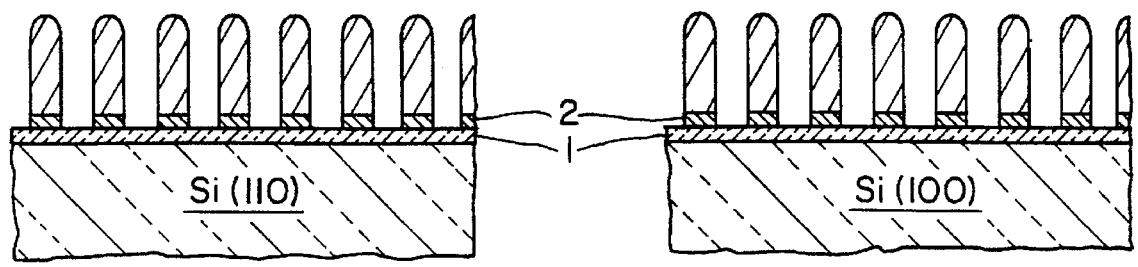
Figure 1F:
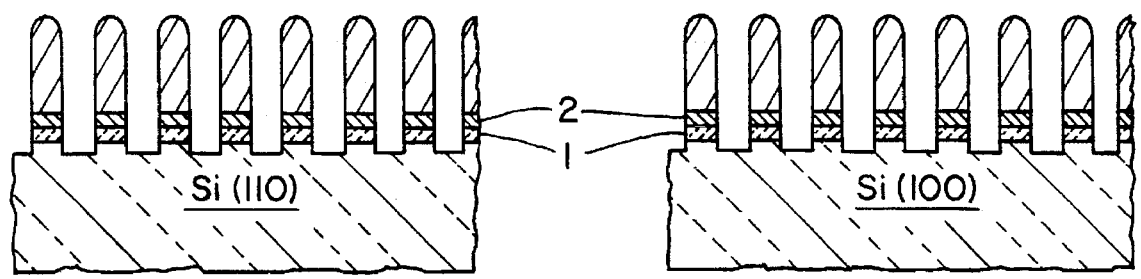

Next, the Ti film, 2, is etched by reactive-ion etching in a low pressure plasma of $CCl_2F_2$, as depicted in FIG. 1e. Generally, a 10%–20% overetch is employed in order to be sure that one has fully etched through the Ti. Next, the $Si_3N_4$ is etched in a $CF_4$ plasma as depicted in FIG. 1f. Again, slight overetching is employed.

Figure 1G:
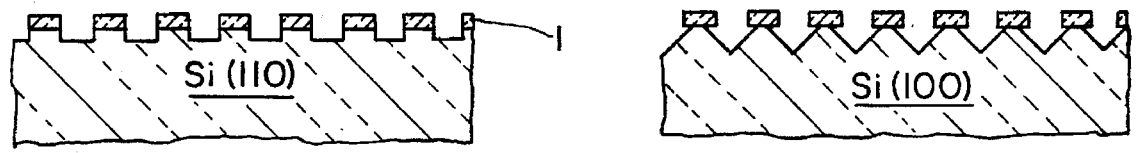
Figure 1H:

Next, the Si substrate is itself etched in one of the well known anisotropic etching solutions such as KOH in water or ethylene diamene pyrocatechol. These etchants have the property that they etch rapidly into the 100 and 110 directions in Si, but extremely slowly in the 111 directions, as has been well described in the literature over the past 15 years. The results of such anisotropic etching are depicted in FIG. 1g where the slow etching (111) planes are indicated. (Such anisotropic etching can also be performed in GaAs and related compounds.) As depicted in FIG. 1h, the $Si_3N_4$ can be removed, for example by etching in a mixture of HF and water. In the case of the (110) substrate, the anisotropic etching results in a profile known as a "square wave" profile; in the case of the (100) substrate the anisotropic etching results in a so-called "(111) sawtooth. wave" profile.

Figure 2:
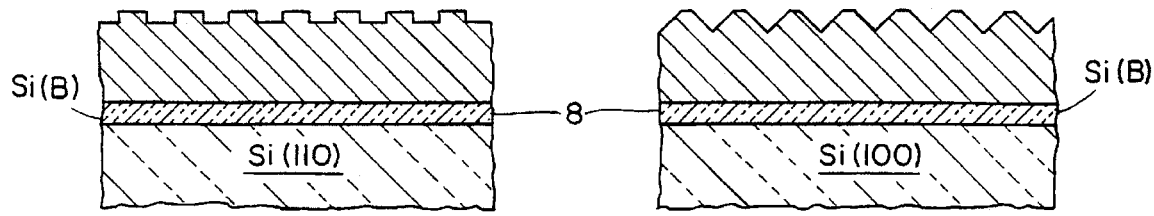
FIG. 2 illustrates techniques for making thin Silicon membrane templates.

The Si substrate patterned as in FIG. 1h can be used directly as the template. Alternatively, the Si can be formed into a thin membrane as depicted in FIG. 2. This can be accomplished, for example, by forming in the Si substrate a boron (B) doped layer, 8, by ion implantation or by epitaxy, as is well known in current practice. Said B-doped layer will act as a stop when the Si is etched from the back side in either of the two above-mentioned anisotropic etchants. The boron doping is an effective stop if the B concentration exceeds about $10^{20}$ per $cm^3$. Alternatively, a lower doping concentration can be used provided an appropriate potential is applied to the B-doped layer from an external voltage source.

Figure 3:
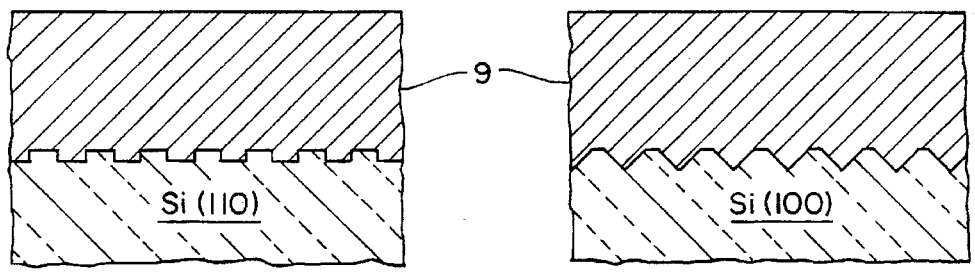
FIG. 3 illustrates another technique for forming membrane templates.

Another means of forming a membrane is to deposit a material, 9, such as $Si_3N_4$, BN or diamond on top of the Si substrate. This process is depicted in FIG. 3, where the deposited material makes a conforming mold of the Si substrate. Following this the Si substrate can be etched away leaving a membrane of the deposited material with the appropriate surface relief geometry, 10.

Figure 4A:
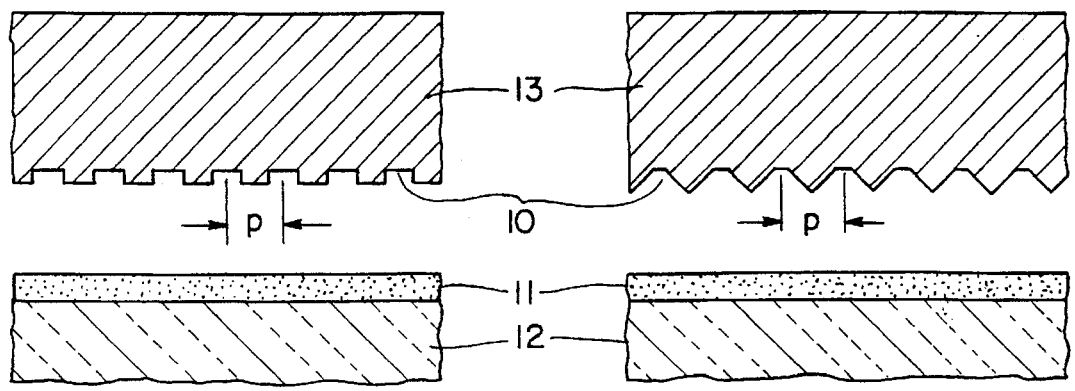
FIGS. 4a and 4b and 4c show the template above and pressed into, respectively, the substrate surface.
Figure 4B:
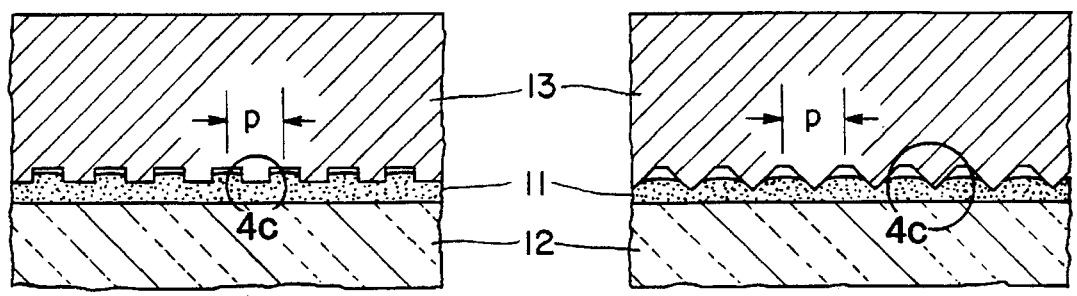
Figure 4C:
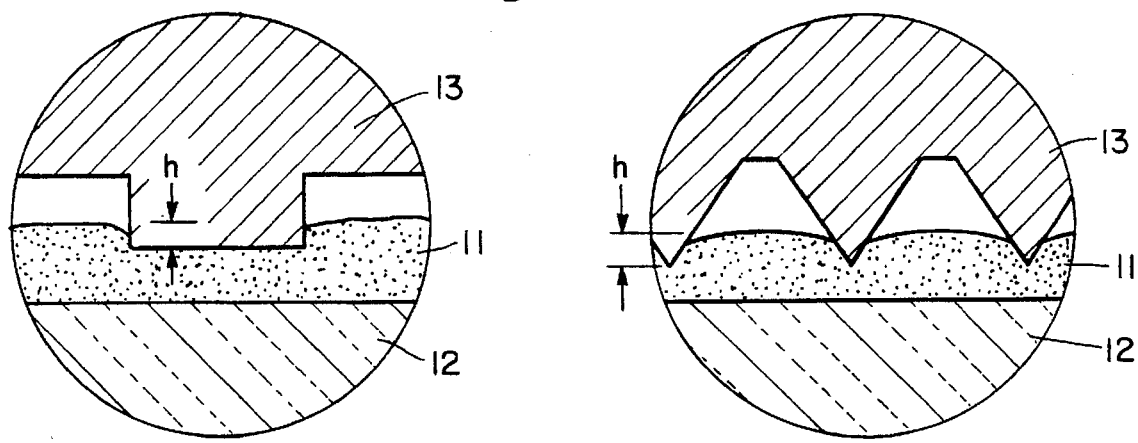

The film to be oriented, 11, is deposited on a substrate, 12, as depicted in FIGS. 4a and 4b and 4c. In FIG. 4a the template, 13, is shown above the surface of said film. In FIG. 4b the template is shown pressed into the surface. This is especially evident in the enlarged views. The template is characterized by a spatial period, p, as depicted in FIGS. 4a and 4b. This period, p, is the repeat distance of the periodic pattern. It is desirable to make p small. A period p=200 nm has been satisfactorily used, although periods larger and smaller than this are also effective.

In FIG. 4b the pressing of the template is shown to deform the film's upper or exposed surface. This occurs if the mobility of the atoms that constitute the film is sufficiently high. In certain materials this can take place at room temperature. In other materials it may be necessary to heat the film to achieve the matter transport and deformation of the film's upper surface. Any technique, whether thermal or nonthermal, which enables substrate atoms to move around and occupy new positions so as to conform to the impressed template falls within the purview of this invention. For example, the template and substrate can be immersed in a fluid (either gas or liquid) which dissolves and transports the material of the film. A film of common table salt, NaCl, in a saturated water solution, would be an example. The depression, h, of the template into the film can be small, however in most cases it should be a reasonable fraction of the period, p, since the driving force for orientation is expected to be proportional to the ratio (h/p). The template, 13, can be moved relative to the film, such as with means for relatively moving 14 shown in FIG. 4(a). With reference to FIG. 4b and 4c, motion can be into and out of the plane of the page. Alternatively, the template can be moved up and down (i.e., vertically) relative to the film. Other types of motion are also feasible.

One use of this technique is in conjunction with the phenomenon of surface-energy-driven secondary grain growth, which has been described extensively in the scientific literature [C. V. Thompson and H. I. Smith, "Surface-Energy-Driven Secondary Grain Growth in Ultrathin (<100 nm) Films of Silicon", Appl. Phys. Lett. 44, 603 (1984) and C. V. Thompson and H. I. Smith, "Secondary Grain Growth in Thin Film", Phase Transitions in Condensed Systems - Experiment and Theory, Mat. Res. Soc. Symp. Proc. 57, 499 (1987)]. In this phenomenon a polycrystalline film is made sufficiently thin that grains extend fully through the film, taking on a so-called columnar structure. Under such circumstances there can be a strong tendency for grains with a specific set of crystalline planes parallel to the substrate surface to grow at the expense of other grains. In effect, grains with minimum surface energy are favored to grow. Under conditions where such a phenomenon occurs, the use of the invention described herein can result in a film with a single crystalline orientation. That is, by impressing the template into the top surface of the film, those grains will be favored to grow which have minimum energy when one set of crystallographic planes is parallel to the bottom surface of the film and another set or sets of planes are parallel to the facets of the template. These facets are indicated as (111) planes in FIG. 1h. By constraining the orientation of at least two sets of crystallographic planes which are not parallel to one another, a specific or single-crystal orientation can be realized in the film.

The phenomenon of surface-energy-driven grain growth occurs when there is sufficient mobility among the atoms of the film that atoms can change their location from a given grain to an adjacent one that has lower surface energy. It is often found that when there is sufficient mobility for grain growth to occur, two other phenomena also occur which militate against further growth. These are agglomeration and grooving. In agglomeration, a film on a substrate lowers its energy not by growth of the grains with minimum energy, but instead by pulling up into a nonplanar mass, thereby reducing the surface area. In grooving, the top surface of a film becomes indented at the boundaries where two different grains meet, the so-called grain boundaries. One of the advantages of the invention herein disclosed is that the template tends to suppress agglomeration and reduces the negative aspects of the grain-boundary-grooving effect.

An advantage of the present invention over that described in U.S. Pat. No. 4,333,793 (ENHANCING EPITAXY AND PREFERRED ORIENTATION), which required the formation of an artificial pattern in the substrate under the film, is that the surface relief structure in a template can be used over and over again, thereby reducing cost. Moreover, a relief structure etched in Si can be made with greater perfection than a relief structure etched in any other substrate. This is because the etching rate in the Si 111 direction can be so much smaller than the etching rate in other directions. As a result, the (111) facets depicted in FIG. 1h are nearly atomically smooth. In (110) substrates the (111) planes are exactly perpendicular to the (110) surface, and in (100) substrates the (111) planes intersect the surface, and each other, at angles precisely defined by crystallographic relationships (e.g., the (111) planes intersect each other at angles of 70.5° and 109.5°). It is not believed to be possible to fabricate such geometrically ideal relief structures by methods based on lithography and reactive ion etching, as would be required, for example, in a substrate of amorphous $SiO_2$. The method of anisotropic chemical etching depicted in FIG. 1 is believed to be the only presently known method of obtaining good quality (111)-faceted sawtooth-wave structures.

Another advantage of the present invention is that the template can be made of extremely hard and relatively inert materials such as diamond and $Si_3N_4$. Deposition of these materials, which is depicted in FIG. 3, is well known in the current art. Moreover, the template material could have a high interfacial energy with respect to the film to be oriented, which would enhance the tendency to promote growth of those grains which were aligned with respect to the template geometry. Templates made of transparent materials such as $Si_3N_4$, diamond or $SiO_2$ would allow one to shine light through them for the purpose of enhancing film mobility.

There has been described novel structures and techniques for orienting crystalline films on substrates by means of external templates. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Epitaxy enhancing structure comprising,
   a substrate having a film to be oriented,
   a template of material of composition different from the composition of said film having high interfacial energy with respect to that of said film capable of being reused having a surface relief structure for orienting said film,
   said template contacting said film to deform the exposed surface of said film while said film is in a solid state to orient said film while said film is in a solid state in accordance with said surface relief structure,
   the deformation being conducive to changing the crystallographic orientation of said film while said exposed surface of said film that is then in contact with said template remains in a solid state,
   said template characterized by a geometry which is impressed on or in said film while said film is in a solid state such that the crystallographic orientation of said film is changed to be in accord with said geometry impressed thereon with said template while said film is in a solid state.

2. Epitaxy enhancing structure in accordance with claim 1 wherein said surface relief structure is formed with a plurality of orthogonally intersecting facets.

3. Epitaxy enhancing structure in accordance with claim 1 and further comprising,
   a fluid medium in contact with said template and the surface of said film adjacent to said template which fluid medium dissolves and transports the material of said film at least from one location to another on said substrate.

4. Epitaxy enhancing structure in accordance with claim 1 wherein said template material is extremely hard compared with the hardness of said film and relatively inert with said thin film.

5. Epitaxy enhancing structure in accordance with claim 4 wherein said template material is selected from the group consisting of diamond and $Si_3N_4$.

6. Epitaxy enhancing structure in accordance with claim 1 wherein said template material is transparent.

7. Epitaxy enhancing structure in accordance with claim 6 wherein said transparent material is selected from the group consisting of $Si_3N_4$, diamond and $SiO_2$.

8. Epitaxy enhancing structure in accordance with claim 1 wherein said surface relief structure is characterized by a periodic pattern of repeat distance p and the deformed exposed film surface is characterized by a depression h into the film by the template which depression h is a fraction of said repeat distance p.

9. Epitaxy enhancing structure in accordance with claim 8 wherein the driving force for orientation is proportional to the ratio h/p.

10. Epitaxy enhancing structure in accordance with claim 8 wherein said repeat distance p is about 200 nm.

11. Epitaxy enhancing structure comprising,
    a substrate having a film to be oriented,
    a template capable of being reused having a surface relief structure for orienting said film,
    said template contacting said film to orient said film in accordance with said surface relief structure,
    wherein said surface relief structure is formed with a plurality of facets intersecting at angles of approximately 70.5° and 109.5°.

12. A method of enhancing epitaxy using a substrate having a film to be oriented and a reusable template having a surface relief structure geometry for orienting said film with the material of said template having high interfacial energy with respect to that of said film which method includes the steps of,
    depositing said film upon said substrate,
    and pressing said template surface relief structure into contact with said film to deform the exposed surface of said film to orient said film in accordance with said surface relief structure while said film is in a solid state to impress said geometry on or in said film while said film is in a solid state such that the crystallographic orientation of said film is changed to be in accord with said geometry impressed thereon with said template while said film is in a solid state,
    the deformation being conducive to changing the crystallographic orientation of said film while said exposed surface of said film that is in contact with said template remains in a solid state.

13. A method in accordance with claim 12 and further including the step of displacing said template relative to said film while maintaining contact therebetween.

* * * * *

UNITED STATES PATENT AND TRADEMARK OFFICE
CERTIFICATE OF CORRECTION

Figure 3A:
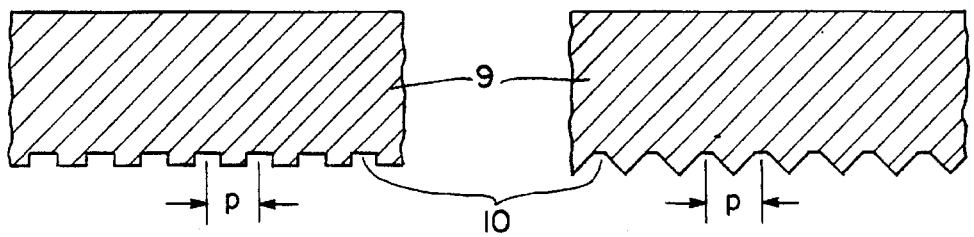

PATENT NO. : 5,639,300
DATED : June 17, 1997
INVENTOR(S) : Henry I. Smith, Carl V. Thompson It is certified that error appears in the above-identified patent and that said Letters Patent is hereby corrected as shown below:

Col. 2, l. 20, "FIG. 3 illustrates" should be --FIGS. 3 and 3a illustrate--.

Col. 2, l. 21, delete "and".

Col. 2, l. 22, delete "and 4c".

Col. 2, l. 23, "." should be --,--.

Col. 2, after l. 23, insert --FIG. 4c is an enlarged view of the encircled portions 4c in FIG. 4b--.

Signed and Sealed this

Third Day of August, 1999

Attest:

Q. TODD DICKINSON

Attesting Officer       Acting Commissioner of Patents and Trademarks